(12) United States Patent  (10) Patent No.: US 6,831,836 B2
Bhatia et al.  (45) Date of Patent: Dec. 14, 2004

(54) LOW THERMAL RESISTANCE INTERFACE FOR ATTACHMENT OF THERMAL MATERIALS TO A PROCESSOR DIE

(75) Inventors: Rakesh Bhatia, Austin, TX (US); Eric DiStefano, Livermore, CA (US)

(73) Assignee: Intel Corporation, Santa Clara, CA (US)

( * ) Notice: Subject to any disclaimer, the term of this patent is extended or adjusted under 35 U.S.C. 154(b) by 12 days.

(21) Appl. No.: 10/374,963

(22) Filed: Feb. 25, 2003

(65) Prior Publication Data

US 2003/0123228 A1 Jul. 3, 2003

Related U.S. Application Data

(63) Continuation of application No. 09/474,791, filed on Dec. 29, 1999, now Pat. No. 6,570,764.

(51) Int. Cl.[7] .................................................. H05K 7/20
(52) U.S. Cl. ..................... 361/705; 361/704; 361/719; 174/16.3; 257/707
(58) Field of Search ........................ 361/687, 704–712, 361/714, 717–719; 174/16.3, 15.1; 257/704–722, 787, 796; 248/316.7, 505, 510; 165/80.2, 80.3, 80.4, 165, 185

(56) References Cited

U.S. PATENT DOCUMENTS

| | | | |
|---|---|---|---|
| 3,328,642 A | | 6/1967 | Haumesser et al. |
| 4,611,238 A | * | 9/1986 | Lewis et al. ................. 257/722 |
| 5,424,580 A | * | 6/1995 | Tustaniwskyj et al. ...... 257/713 |
| 5,430,609 A | | 7/1995 | Kikinis |
| 5,455,457 A | * | 10/1995 | Kurokawa ................... 257/712 |
| 5,525,835 A | * | 6/1996 | Nishiguchi .................. 257/712 |
| 5,623,394 A | * | 4/1997 | Sherif et al. ................. 361/705 |
| 5,719,745 A | | 2/1998 | Agonafer et al. |
| 5,825,625 A | | 10/1998 | Esterberg et al. |
| 5,907,474 A | | 5/1999 | Dolbear |
| 5,918,665 A | | 7/1999 | Babcock et al. |
| 5,933,325 A | | 8/1999 | Hou |
| 6,016,006 A | | 1/2000 | Kolman et al. |
| 6,055,158 A | | 4/2000 | Pavlovic |
| 6,101,093 A | | 8/2000 | Wong et al. |
| 6,101,096 A | | 8/2000 | MacGregor et al. |
| 6,146,921 A | * | 11/2000 | Barrow ........................ 438/122 |
| 6,282,095 B1 | | 8/2001 | Houghton et al. |

* cited by examiner

*Primary Examiner*—Michael Datskovsky
(74) *Attorney, Agent, or Firm*—Blakely, Sokoloff, Taylor & Zafman LLP

(57) ABSTRACT

A heat sink comprises a side including a structural member defining a distance between a heat generating structure and the second side of the heat sink.

16 Claims, 3 Drawing Sheets

LOW THERMAL RESISTANCE INTERFACE FOR ATTACHMENT OF THERMAL MATERIALS TO A PROCESSOR DIE

CROSS-REFERENCE TO RELATED APPLICATION

This application is a continuation of application Ser. No. 09/474,791, filed Dec. 29, 1999 now U.S. Pat. No. 6,570,764, by Intel Corporation, entitled LOW THERMAL RESISTANCE INTERFACE FOR ATTACHMENT OF THERMAL MATERIALS TO A PROCESSOR DIE.

FIELD

The embodiments disclosed herein relate to electronic devices and more particularly to the dissipation of heat generated by microprocessors.

BACKGROUND

In operation, microprocessors and other electronic devices generate heat. Excess heat can damage the device if it is not dissipated. Therefore, generally microprocessors and other heat-generating electronic devices utilize heat dissipating structures or heat sinks as a conductor to dissipate excess heat. A conventional configuration for dissipating heat from a microprocessor is to mount a heat sink of a metal material (such as aluminum or copper) over the microprocessor. Mounting a metal heat sink directly over the microprocessor is not a favored practice, because of the poor conductivity achieved by the union of the metal heat sink and the microprocessor. In addition, the surface of the heat sink material is generally comprised of micro-pores or surface roughness and the surface of the microprocessor has a crown shape. Accordingly, the union of a heat sink and the microprocessor is not uniform leading to the presence of air pockets and poor thermal conductivity. Therefore, a thermal interface material, such as thermal grease, a thermal elastomer, or a phase-change material is interposed between the microprocessor and the heat sink. The thermal interface material provides improved thermal conductivity between the processor and the heat sink. The thermal interface material tends to fill the micro-pores and therefore makes the transition between the microprocessor and the heat sink more uniform.

A microprocessor or other heat-generating electronic device generally is affixed to a printed circuit board (PCB). In the case of a microprocessor, a heat sink is usually affixed to the PCB through bolts or screws with an established gap or bond line thickness between the heat sink and the microprocessor. In portable computer applications, for example, the bond line thickness associated with conventional microprocessor packaging is approximately 5 mils±2 mils, the difference generally attributable to differences in microprocessor heights. It is desirable, in one sense, to establish a consistent bond line thickness. One way this is established is by securing the heat sink to the PCB under pressure. The amount of pressure that may be applied to heat sink affixation is limited, however, to about 20 to 100 pounds per square inch to avoid damage to the microprocessor. The amount of compression that a thermal interface material can withstand is also limited. Thermal interface material under compression tends to flow out of the gap between the heat sink and the microprocessor under compression and additionally tends to dry out with power cycling. The compressive limitation of the thermal interface material reduces the reliability of the thermal interface material.

Despite its limitations, it is desirable to use thermal interface material between a heat sink and a microprocessor or other heat-generating electronic device. What is needed is a configuration whereby thermal interface material may be utilized and the reliability issues present in prior art configurations can be avoided.

DETAILED DESCRIPTION

The embodiments disclosed herein relate to a heat sink comprising a protuberance having a thickness defining a distance between a heat generating structure and a heat sink. In this manner, utilizing the heat sink as a heat dissipating element in conjunction with a microprocessor affixed to a printed circuit board, the protuberance defines a volume for a thermal interface material between the heat sink and a heat generating electronic device such as the microprocessor. A desired bond line thickness may be established between a heat sink and a heat generating electronic device to improve the thermal resistance of the thermal interface material and the heat sink and provide consistency of thermal resistance between packages. An apparatus incorporating such a heat sink is also described.

Figure 1:
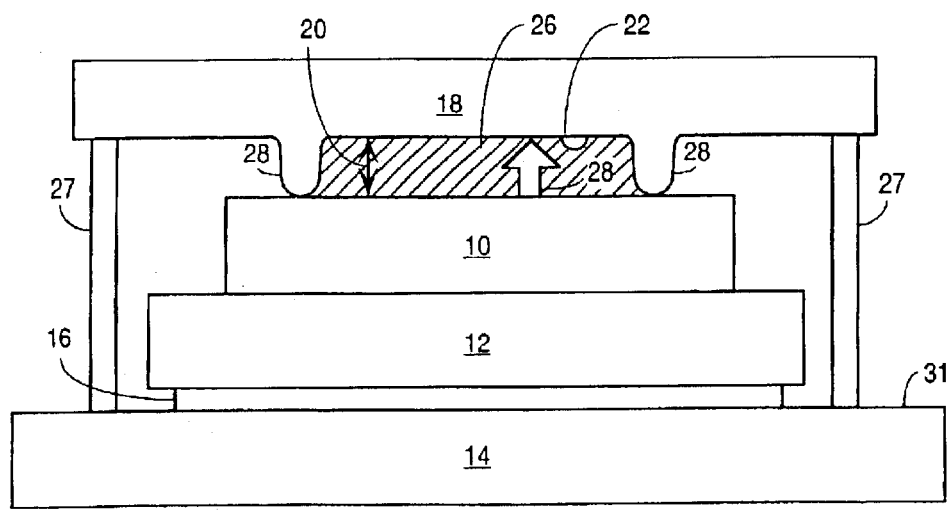
FIG. 1 is a schematic side view of a packaged microprocessor according to an embodiment of the invention.

FIG. 1 shows a schematic side view of a packaged electronic device such as a microprocessor. In FIG. 1, microprocessor 10 (or other heat generating device) includes socket 12 that is mounted on printed circuit board 14 utilizing, for example, ball grid array 16. Heat sink 18 is attached to printed circuit board 14 through supports 27. Heat sink 18 is, for example, a block or plate of a metal such as aluminum or copper. Heat sink 18 is attached to printed circuit board 14 in a position that defines bond line thickness or gap 20 between bottom surface 22 of heat sink 18 and top surface 24 of microprocessor 10. Thermal interface material 26, such as a thermal grease, elastomer, or phase-change material, or other thermally conductive material 26 spans gap 20 and defines heat conducting path 28 from microprocessor 10 to heat sink 18. A quantity of thermal interface material such as a thermal grease, elastomer, phase-change material or other material sufficient to fill thermal gap 20 and provide an adequate thermal path for heat generated by microprocessor 10 is shown.

In the embodiment shown in FIG. 1, heat sink 18 includes protuberances 28 defining gap 20 between heat sink 18 and microprocessor 10. Protuberances 28 establish gap 20 at a desired fixed height. In this manner, thermal interface material 26 may be positioned between heat sink 18 and microprocessor 10 without being subject to compression that can cause squeezing out and drying of the material. Protuberances 28 also establish a consistent bond line thickness or gap 20 between different units, so that the same thermal gap is consistently established to consequently establish a consistent adequate thermal path among packaged microprocessors.

In the embodiment shown in FIG. 1, supports 27 such as pins or bolts are securely attached to heat sink 18 at the upper end and pass through four corresponding holes in printed circuit board 14 to affix heat sink 18 to printed circuit board 14. In one embodiment, supports 27 utilize locking clips and coil spacer springs surrounding the supports to provide a consistent tension between heat sink 18 and printed circuit board 14. This tension is not reflected against thermal interface material 26 as protuberances 28 shield thermal interface material 26 from any pressure applied by supports 27.

Figure 2:
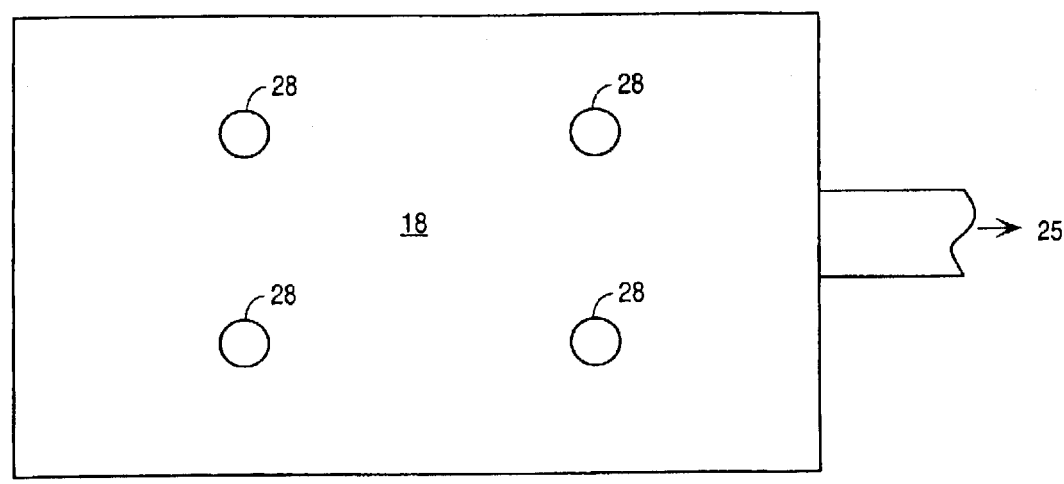
FIG. 2 is a planar bottom view of the structure of FIG. 1.

FIG. 2 shows a planar bottom side view of heat sink 18 having protuberances 28. In one embodiment, heat sink 18 is a metal such as aluminum or copper formed by a die-casting method. Protuberances 28 may also be formed according to die-casting techniques known in the art. Protuberances are formed to a height or thickness, in one embodiment, of approximately 5 mils for use with modern microprocessors and a desirable bond line thickness as known in the art. In this manner, protuberances 28 may be considered dimples in a surface of heat sink 18. Cooling mechanism 25 such as a chain transfer mechanism as known in the art may be incorporated in heat sink 18 to dissipate heat from heat sink 18 to a fan or the environment as known in the art.

Figure 3:
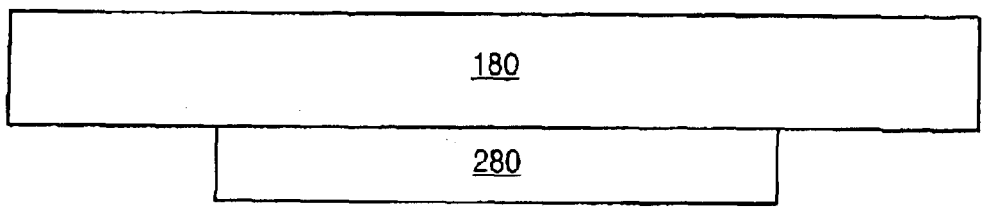
FIG. 3 is a schematic side view of a second embodiment of a heat sink according to the invention.
Figure 4:
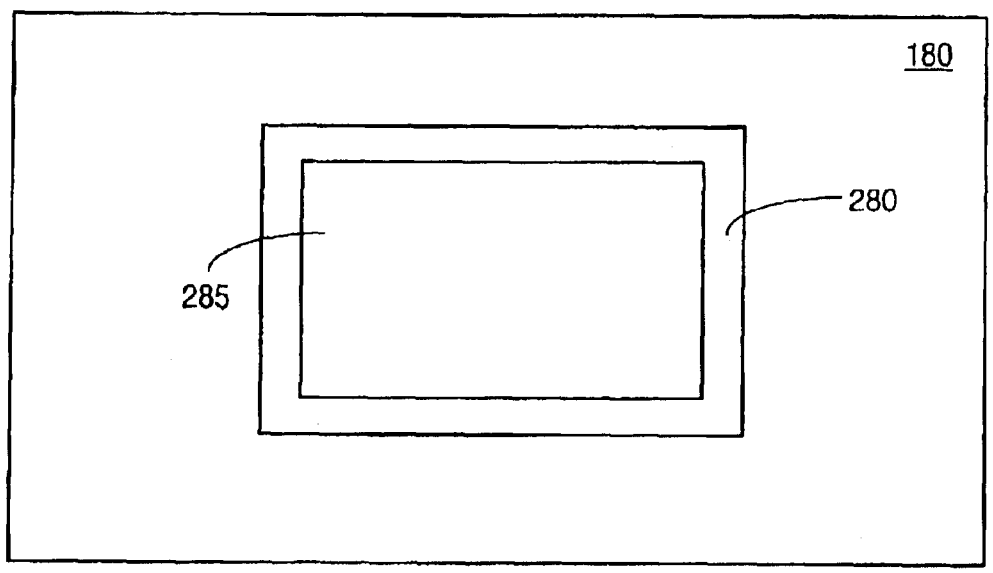
FIG. 4 is a planar bottom view of the structure of FIG. 3.

FIG. 3 shows a second embodiment of a heat sink according to the invention. In this embodiment, a surface of heat sink 180 includes protuberance 280 that is a frame having four sides extending from a surface of heat sink 180. FIG. 4 shows a bottom planar view of the second embodiment of the invention. As shown in FIG. 4, protuberance 280 consists of a frame having four sides defining opening 285 for thermal interface material. Similar to the embodiment shown in FIGS. 1 and 2, protuberance 280 allows thermal interface material to reside in opening 285 between a microprocessor and the bottom surface of heat sink 180 without being subject to compression. Protuberance 280 of a frame, in one embodiment, is established at a bond line thickness of approximately 5 mils. In one embodiment, protuberance 280 is formed utilizing die-casting techniques along with at least the bottom surface of heat sink 180.

It is to be appreciated that the embodiment illustrated in the figures represent, in particular, two configurations of a heat sink having a suitable protuberance or protuberances to establish a bond line thickness and allow thermal interface material to be placed between the heat sink and the microprocessor without compression. Many other configurations of protuberances, including protuberances that are not die-cast in the heat sink but are separate components may be utilized.

Figure 5:
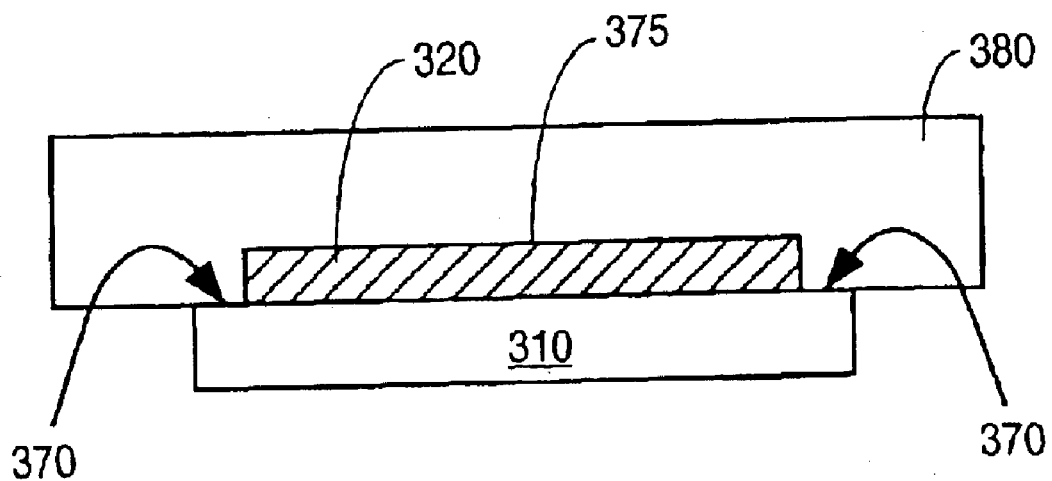
FIG. 5 is a schematic side view of a portion of a heat sink over a microprocessor according to a third embodiment of the invention.
Figure 6:
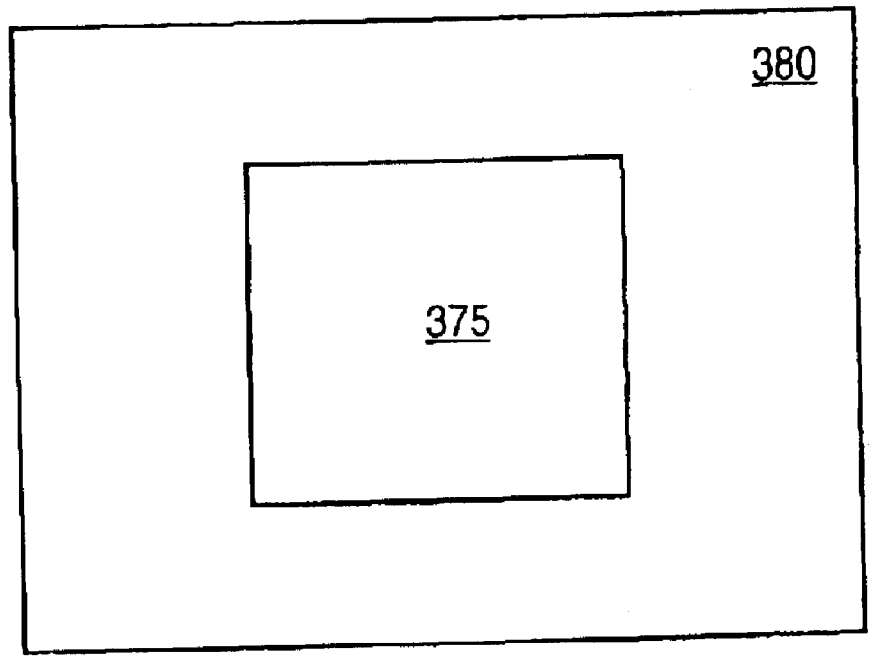
FIG. 6 is a planar bottom view of the structure of FIG. 5.

FIG. 5 shows still another embodiment wherein a recess is formed in the heat sink to provide a die-referenced bond line thickness between the heat sink and a microprocessor. FIG. 5 shows heat sink 380 having recess 375 over a portion of microprocessor 310. Between heat sink 380 and microprocessor 310 in recess 375 is thermal interface material 320 such as a thermal grease. The recess defines a volume and the walls of the recess trap the thermal interface material over microprocessor 310, inhibiting grease migration during power or temperature cycles. Heat sink 380 contacts microprocessor 310 at contact points 370. FIG. 6 shows a planar bottom view of heat sink 380.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

We claim:

1. A heat sink comprising:

a side; and a plurality of structural members extending from the side, the structural member to contact a surface of a heat generating structure and having a fixed thickness to define a distance of open space between the surface of the heat generating structure to be contacted and the side.

2. The heat sink of claim 1, wherein the structural member comprises a protuberance, the protuberance contacting the surface of the heat generating structure and having a length extending from the side of the heat sink defining the distance between the heat generating structure and the side of the heat sink.

3. A heat sink comprising:

a side;

a plurality of structural members extending from the side, the structural member to contact a surface of a heat generating structure and having a fixed thickness to define a distance of open space between the surface of the heat generating structure to be contacted and the side;

wherein each structural member comprises a protuberance, the protuberance contacting the surface of the heat generating structure and having a length extending from the said of the heat sink defining the distance between the heat generating structure and the side of th heat sink; and wherein the protuberance comprises a protrusion having a generally parabolic shape, the side of the heat sink comprising a plurality of protuberances.

4. The heat sink of claim 3, wherein the protuberance comprises a frame defining an area between opposing sides of the frame.

5. The heat sink of claim 3, wherein the length of the protuberance comprises approximately 5 mils.

6. An apparatus comprising:

a heat generating element;

a heat sink coupled to the heat generating element, the heat sink comprising a first side, a second side, and a plurality of structural member extending from the second side, the structural member contacting a surface of the heat generating element and having a fixed thickness defining a distance of open space between the contacted surface of the heat generating element and the second side of the heat sink;

a thermal interface material disposed between the heat generating element and the heat sink;

wherein the protuberance comprises a protrusion having a generally parabolic shape, the second side of the heat sink comprising a plurality of protuberances.

7. The apparatus of claim 6, wherein the structural member of the heat sink comprises a protuberance, the protuberance contacting the surface of the heat generating element and having a length extending from the second side of the heat sink defining the distance between the heat generating element and the second side of the heat sink.

8. An apparatus comprising:

a heat generating element;

a heat sink coupled to the heat generating element, the heat sink comprising a first side, a second side, and a plurality of structural member extending from the second side, the structural member contacting a surface of the heat generating element and having a fixed thickness defining a distance of open space between the contacted surface of the heat generating element and the second side of the heat sink;

a thermal interface material disposed between the heat generating element and the heat sink;

wherein the structural member of the heat sink comprises a protuberance, the protuberance contacting the surface of the heat generating element and having a length extending from the second side of the heat sink defining the distance between the heat generating element and the second side of the heat sink;

wherein the protuberance comprises a protrusion having a generally parabolic shape, the second side of the heat sink comprising a plurality of protuberances.

9. The apparatus of claim 8, wherein the protuberance comprises a frame defining an area between opposing sides of the frame.

10. The apparatus of claim 8, wherein the length of the protuberance comprises approximately 5 mils.

11. The apparatus of claim 8, wherein the heat generating element is an integrated circuit.

12. An apparatus comprising:

a heat generating element; and a heat dissipating element coupled to the heat generating element, the heat dissipating element comprising a side and having a plurality of means for establishing a separation between the heat generating element and the side of the heat dissipating element, the means for establishing extending from the side and contacting a surface of the heat generating element an having a fixed thickness defining a distance of open space between the contacted surface of the heat generating element and the side of the heat dissipating element.

13. The apparatus of claim 12, wherein the separation means comprises at least one protuberance formed in a surface of the heat dissipating element.

14. An apparatus comprising:

a printed circuit board;

a microprocessor mounted on the printed circuit board; and a heat sink coupled to the printed circuit board comprising a protuberance contacting a surface of the microprocessor and having a fixed thickness defining a distance of open space between the contacted surface of the microprocessor and a surface of the heat sink; and wherein the heat sink comprises a plurality of protuberances, each protuberance comprising a protrusion having a generally parabolic shape.

15. The apparatus of claim 14, wherein the protuberance of the heat sink comprises a frame defining an area between opposing sides of the frame.

16. The apparatus of claim 14, further comprising a thermal interface material disposed between the surface of the microprocessor and the heat sink.

* * * * *

UNITED STATES PATENT AND TRADEMARK OFFICE
CERTIFICATE OF CORRECTION

PATENT NO. : 6,831,836 B2  
DATED : December 14, 2004  
INVENTOR(S) : Bhatia et al.

It is certified that error appears in the above-identified patent and that said Letters Patent is hereby corrected as shown below:

Column 4,  
Line 28, delete "said" and insert -- side --.  
Line 30, delete "th" and insert -- the --.

Column 6,  
Line 2, delete "an" and insert -- and --.

Signed and Sealed this

Twenty-fourth Day of May, 2005

JON W. DUDAS  
*Director of the United States Patent and Trademark Office*